United States Patent [19]

Hogg

[11] 3,936,739
[45] Feb. 3, 1976

[54] METHOD AND APPARATUS FOR GENERATING ERROR CORRECTED SIGNALS

[75] Inventor: Walter R. Hogg, Miami Lakes, Fla.

[73] Assignee: Coulter Electronics, Inc., Hialeah, Fla.

[22] Filed: Feb. 12, 1974

[21] Appl. No.: 441,752

[52] U.S. Cl. .............................. 324/71 CP; 328/142
[51] Int. Cl.² .................... G01N 27/00; G01G 7/12
[58] Field of Search ................. 324/71 CP; 328/142

[56] References Cited
UNITED STATES PATENTS

| 3,557,352 | 1/1971 | Hogg et al. .................. 324/71 CP X |
| 3,801,904 | 4/1974 | Hogg et al. ...................... 324/71 CP |

Primary Examiner—Robert Segal
Attorney, Agent, or Firm—Silverman & Cass, Ltd.

[57] ABSTRACT

A method and apparatus for automatically generating error corrected pulses in response to particle pulses which are subject to error due to coincidence. The subject apparatus includes a generator for generating error corrected pulses which has a variable pulse repetition rate controlled via an applied variable control signal. A pulse duration modifying circuit receives the particle pulses and develops first pulses each having a duration equal to a predetermined function of the duration of a particle pulse. A control circuit receives the error corrected pulses and develops a second signal in response thereto. The development of the second signal via the control circuit is inhibited in response to the presence of first pulses coupled thereto from the pulse duration modifying circuit. A comparison circuit develops the control signal which varies in accordance with the difference between the repetition rate of the particle pulses and the third signal.

32 Claims, 9 Drawing Figures

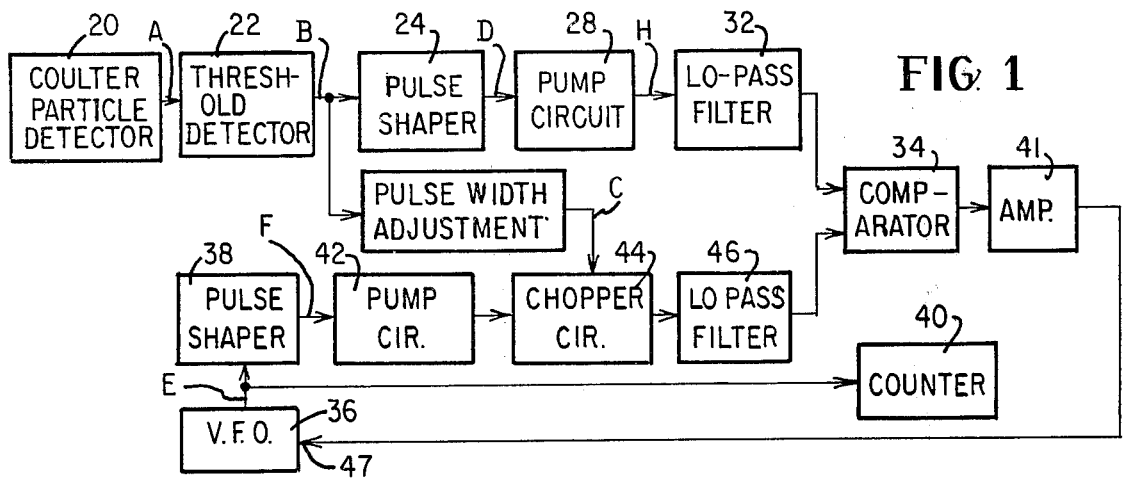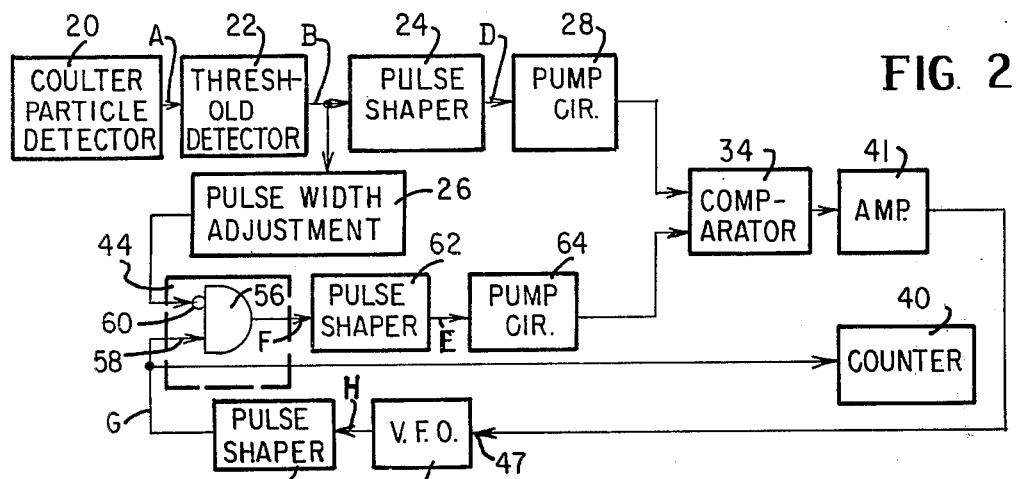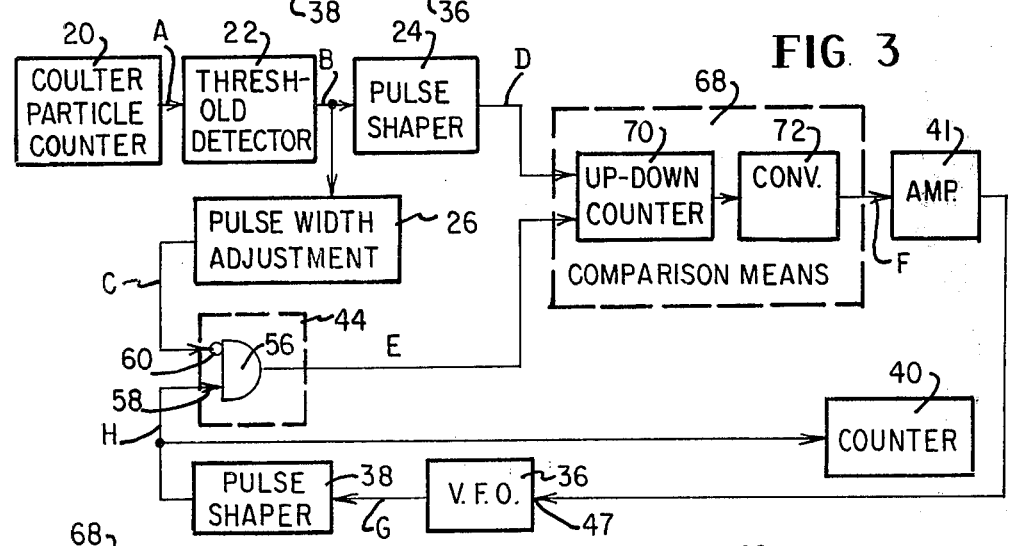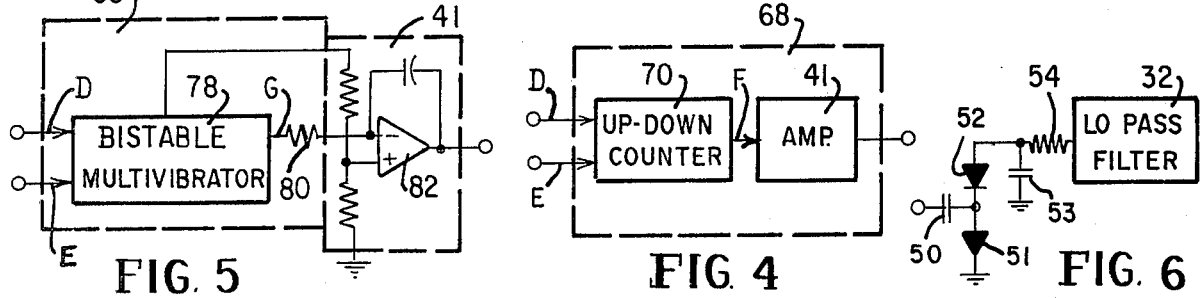

METHOD AND APPARATUS FOR GENERATING ERROR CORRECTED SIGNALS

BACKGROUND OF THE INVENTION

Now well known in the art of electronic particle counting and analyzing is apparatus marketed primarily under the registered United States trademark "COULTER COUNTER," owned by the assignee of this application. Such apparatus and portions thereof are disclosed in several U.S. Pat. Nos., for example: 2,656,508; 2,985,830; and 3,259,820 (each in class 324-71). A significantly important portion of a Coulter type of apparatus is a minute scanning aperture or sensing zone, through which particles pass and are detected at a rate often well in excess of 1000 per second. Because of the physical parameters of the scanning aperture, and because of particle concentration, coincidence of particles within the aperture occurs quite often. The effect is that one particle is detected and counted, instead of two. The coincidence of two particles in the scanning aperture is commonly referred to as primary coincidence. Furthermore, the simultaneous passage of two particles, both of which are too small to be included in a counter, creates an additive effect which produces a spurious count of a fictitious large particle. This is commonly referred to as secondary coincidence. Although such primary and secondary forms of coincidence are random in time and nonlinear, they follow a statistically ascertainable form from which curves, tables and formula are obtainable. It has also been found that the nonlinear characteristic of coincidence error is related to the repetition rate and duration of the pulses due to the detected particles. The present method and apparatus is directed towards the counting of particles having a narrow range of sizes, consequently secondary coincidence does not present a problem which must be considered.

Heretofore, the operator of an electronic particle counting and analyzing device such as is commercially available under the registered United States trademark "COULTER COUNTER" would obtain a particle count by passing a suspension of particles through the device. The operator would then refer to a coincidence correction chart which presented the proper error corrected count for a very large selection of counts produced by the device. Although the use of charts provides an accurate result, it is both time consuming and prohibits the fully automatic recording and processing of error correct counts. In addition, the accumulating count during analysis is uncorrected. Furthermore, different charts must be used with apertures of different sizes.

The use of analog, nonlinear meters and/or elements at the output stage of the "COULTER COUNTER" also has been accomplished with limited success, however, in many uses a direct ready digitized output is preferred. Heretofore it has been impossible to provide circuitry which compensates or accounts for the nonlinear characteristics of coincidence error while providing a direct reading digitized form of output which may be counted.

SUMMARY OF THE INVENTION

It is therefore an object of this invention to provide a method and apparatus for automatically generating error corrected counting signals and counts in response to particle pulses from an electronic particle counting and analyzing device which are subject to coincidence error.

In practicing this invention, a voltage controlled oscillator is provided for generating error corrected signals. The frequency or repetition rate of the error corrected signals is variable in accordance with a control signal coupled to the voltage controlled oscillator. The received particle pulses are coupled to a pulse-width adjusting circuit which is operative in response to each received particle pulse to develop a first pulse having a duration which is a function of the duration of the particle pulse. A control circuit receives the error corrected pulses and develops a second signal. The control circuit also is operative in response to receipt of the first pulses simultaneously with the receipt of the error corrected pulses to control the development of the second signal. A comparator is operative in response to the difference between the repetition rate of the particle pulses and the second signal to develop the control signal which varies in accordance with the difference between the repetition rate of the particle pulses and the second signal. The output of the variable frequency oscillator is coupled to a counter which counts the error corrected signals and develops an error corrected count.

BRIEF DESCRIPTION OF THE DRAWING

FIG. 1 is a block diagram of an apparatus embodying the invention;

FIG. 2 is a block diagram of a second embodiment of the apparatus of the invention;

FIG. 3 is a block diagram of another embodiment of the apparatus of the invention;

FIG. 4 is a block diagram showing an alternate implementation for a portion of the apparatus shown in FIG. 3;

FIG. 5 is a block diagram showing another alternate implementation for a portion of the apparatus shown in FIG. 3; and FIG. 6 is a schematic diagram showing circuitry employed in one portion of the apparatus in FIGS. 1 and 2.

DETAILED DESCRIPTION OF THE INVENTION

Figure 1A:
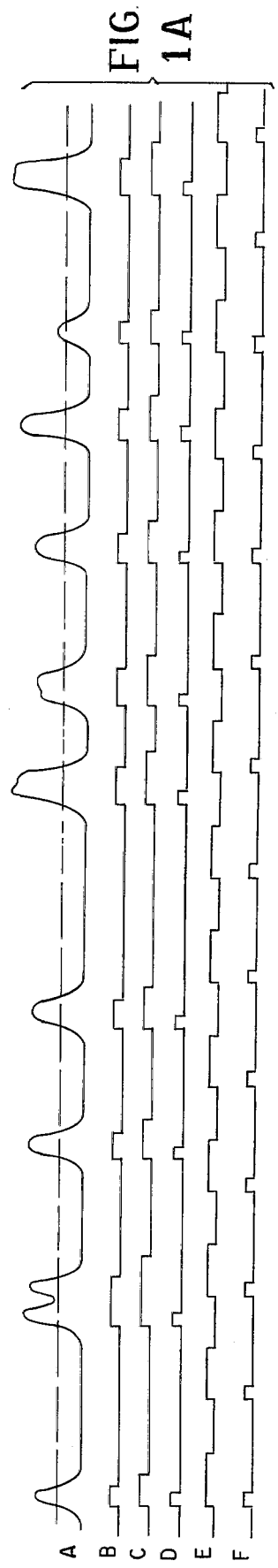
FIG. 1A is a timing diagram showing waveforms at various locations in FIG. 1.

Referring to FIG. 1, particle pulses, such as are developed by a Coulter type particle counter and analyzer, in response to a particle passing through a minute scanning aperture are coupled from a Coulter type particle detector 20 to a threshold detector 22 via conductor A. Waveform A in FIG. 1A shows waveforms of particle pulses coupled from the Coulter type particle detector 20 to threshold detector 22. Various types of particle pulses are shown in waveform A of FIG. 1A which can result from the detection of various types of one or more particles by the Coulter type particle detector 20. For example, the second particle pulse from the left can result from an imperfect coincidence of two particles in the scanning aperture of the Coulter type particle detector 20. This type of particle pulse waveform is commonly identified as a "camelback" pulse.

Threshold detector 22 is operative in response to particle pulses coupled thereto in excess of a predetermined amplitude to develop pulses of fixed amplitude at conductor B. The waveforms appearing on conductor B are shown in waveform B, FIG. 1A. The duration of each pulse is equal to the period for which the particle pulse coupled to threshold detector 22 exceeds the predetermined amplitude. It is to be understood that the ultimate count is somewhat dependent upon the setting of the threshold level of threshold detector 22. That is, if the threshold is raised, it is possible for example that the ninth pulse in waveform A of FIG. 1A would not be detected. Furthermore, the second pulse from the left which is shown as a "camelback" pulse, can result in two pulses if the threshold is raised above the valley of the "camelback" pulse.

The pulses developed by threshold detector 22 are coupled to a pulse shaper 24 and a pulse width adjusting circuit 26 via conductor B and are shown in waveform B of FIG. 1A. Pulse shaper 24 in the preferred embodiment can be a monostable multivibrator commonly known as a "one shot" which is triggered in response to the leading edges of the pulses coupled thereto from threshold detector 22 via conductor B and develops pulses of predetermined fixed duration. The pulses developed by pulse shaper 24 are coupled via conductor D to pump circuit 28 and are shown in waveform D of FIG. 1A.

Pump circuit 28 may be a circuit such as shown in FIG. 6 which will be more fully explained in a subsequent portion of this application. Pump circuit 28 receives the pulses from pulse shaper 24 and develops a voltage which is proportional to the repetition rate of the pulses coupled from pulse shaper 24. The pulses coupled to pump circuit 28 from pulse shaper 24 have a uniform or constant duration which is selected such that it will allow pump circuit 28 to develop a variable voltage signal thereacross in response to the repetition rate of the pulses from pulse shaper 24. The voltage signal developed by pump circuit 28 is coupled to low pass filter 32 where it is filtered to remove any AC components due to the pulses developed by pulse shaper 24. The filtered voltage signal is coupled from low pass filter 32 to one input of comparator 34. Comparator 34 may for example be two equal resistors with one input coupled to filter 32 or a differential amplifier with one input coupled to filter 32.

Pulse width adjustment circuit 26 develops first pulses at conductor C, as shown in waveform C of FIG. 1A, in response to the pulses coupled from threshold detector 22. The first pulses developed at conductor C by pulse width adjustment circuit 26 have a duration which is a function of the duration of the pulses coupled to pulse width adjustment circuit 26 from threshold detector 22. In the preferred embodiment, pulse width adjustment circuit 26 will develop first pulses at conductor C each having a duration greater than their corresponding detected pulses. For example, the first pulses can have a duration which is greater by a predetermined percentage of the duration of the corresponding detected pulses. In the preferred embodiment, pulse width adjustment circuit 26 can include a pulse stretching circuit such as is commonly known in the art. The first pulses developed by pulse width adjustment circuit 26 are coupled via conductor C to a chopper circuit 44.

A voltage controlled variable frequency oscillator 36 can develop symmetrical output signals as shown in waveform E of FIG. 1A; which are coupled to a pulse shaper 38 and counter 40 via conductor E. These pulses are the error corrected pulses which are counted by counter 40 in order to show the corrected count of particle pulses detected by the Coulter type particle detector 20. The pulses on conductor E are shown in waveform E of FIG. 1A. Pulse shaper 38 is identical to pulse shaper 24. That is, it is a monostable multivibrator which will generate a pulse of uniform or constant duration when triggered by the leading edge of the pulses from variable frequency oscillator 36. The pulses developed by pulse shaper 38 are coupled via conductor F to a pump 42 are are shown in waveform F of FIG. 1A.

The pump circuit 42 is identical in circuitry to the pump circuit 28 and low pass filter 32. The pulses coupled to pump circuit 42 from pulse shaper 38 via conductor F will cause a voltage signal to be developed by pump circuit 42 which is proportional to the repetition rate of the pulses coupled from pulse shaper 38. The voltage signal developed by pump circuit 42 is coupled to chopper circuit 44, as are the first pulses developed on conductor C by pulse width adjustment circuit 26.

Chopper circuit 44 chops holes in the voltage signal coupled from pump circuit 42, the holes having a duration equal to the duration of the pulses developed by pulse width adjustment circuit 26. The chopped voltage signal or second signal is coupled from chopper circuit 44 to low pass filter 46. Low pass filter 46 acts to average the chopped voltage signal coupled thereto and develop a varying DC voltage signal which is coupled to the second input of comparator 34.

Comparator 34 compares the varying voltage signals coupled from low pass filters 32 and 46 and develops a control voltage which varies in accordance with the difference in voltage level between the voltage signals coupled from low pass filter 32 and low pass filter 46. In the preferred embodiment, if the voltage signals coupled from low pass filters 32 and 46 to comparator 34 are equal the control voltage at the output of comparator 34 will be zero. If the voltage coupled from low pass filter 32 is greater than the voltage coupled from low pass filter 46, the control voltage at the output of comparator 34 will be a positive voltage which is proportional to the difference between the voltages coupled from low pass filters 32 and 46. If the voltage from low pass filter 46 is greater than the voltage coupled from low pass filter 32, the control voltage at the output of comparator 34 will be a negative voltage proportional to the difference between the voltage coupled from low pass filters 32 and 46.

The control voltage developed by comparator 34 is coupled to low pass amplifier 41 where it is amplified and coupled to the control input 47 of variable frequency oscillator 36. Variable frequency oscillator 36 is preferably designed such that when the voltage at 47 increases, its frequency of oscillation increases and when the voltage at 47 decreases the frequency of oscillation decreases. As in all negative feedback systems, equilibrium will prevail when the control voltage developed by comparator 34 is exactly sufficient to place at input 47 of variable frequency oscillator 36 the voltage necessary to cause its output frequency to maintain the requisite control voltage 47. By making the gain of the amplifier sufficiently high, this control voltage can be made vanishingly small, resulting in equality of the voltages at the outputs of the low pass filters 32 and 46.

The result of the operation of the apparatus shown in FIG. 1 is to cause variable frequency oscillator 36 to develop an output signal on conductor E whose frequency and repetition rate is greater than the repetition rate of the detected particle pulses coupled from the Coulter type particle detector 20. The difference in the repetition rate of the signals developed by variable frequency oscillator 36 and the resultant difference in the number of pulses coupled to counter 40 per unit time or in a sampling period is related to the repetition rate and duration of the detected particle pulses. The nonlinear relationship between the number of detected particle pulses and error corrected pulses, is due to the fact that the amount of correction, as a percentage of the repetition rate of the incoming pulses, is an increasing function of the repetition rate. The pulse width adjustment circuit 26 permits the width of the pulses at C to be varied to account for minor inaccuracies in the correction theory, such that a particle count is truly proportional to known sample concentration, since chopper circuit 44 chops the number of error-corrected pulses by the repetition rate and duration of these adjusted pulses. The voltage signal resulting from this chopping function will have a nonlinear relationship to the voltage signal developed in response to the repetition rate of the detected particle pulses. The nonlinear relationship corresponds to the nonlinear relationship necessary in order to compensate for coincidence errors introduced as a result of the arrival rate of the detected particles. The voltage signal from chopper circuit 44 when compared with the voltage signal which is developed as a result of the repetition rate of the detected particle pulses, will yield a control voltage which is coupled to the oscillator in order to cause the oscillator to change its frequency, i.e. repetition rate, and to develop pulses representative of the true or corrected count of the number of particles being detected.

The connection from amplifier 41 to the control input 47 of variable frequency oscillator 36 constitutes a feedback loop. The feedback to variable frequency oscillator 36 yields a closed loop system whose response to variations in repetition rate and duration of detected pulses is limited only by circuit time constants, thereby quickly modifying the number of error corrected pulses generated, in a nonlinear manner, in order to accumulate continuously a true error-corrected count.

Referring to FIG. 6 there is shown circuitry which can be employed in pump circuits 28 and 42 of FIG. 1. Pulses from pulse shaper 24 are coupled to capacitor 50 causing capacitor 50 to charge through diode 51. The charge is built up on a capacitor 50 while the signal is positive going and after the peak is reached capacitor 50 discharges through diode 52 dumping its charge into capacitor 53. Capacitor 53 is preferably large with respect to capacitor 50 so that the voltage change is small. The voltage developed across capacitor 53 is coupled through resistor 54 to a load which can be a low pass filter such as low pass filter 32 in FIG. 1.

Figure 2A:
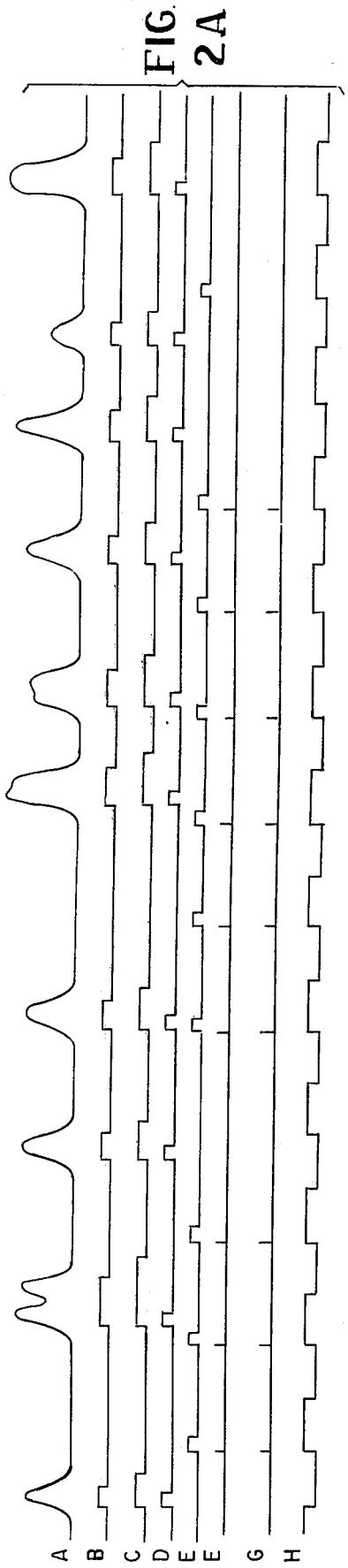
FIG. 2A is a waveform diagram showing wavelengths at various points in the apparatus shown in FIG. 2.

Referring to FIG. 2, there is shown another embodiment of the apparatus for generating error corrected signals. In this apparatus, components which are identical to the components shown in FIG. 1 are given identical reference numbers. Waveforms appearing on conductors are shown in FIG. 2A and given reference numbers corresponding to the reference numbers for the conductors on which they appear.

Detected particle pulses are coupled from Coulter type particle detector 20 to threshold detector 22 via conductor A. Threshold detector 22 develops pulses of fixed amplitude in response to detected particle pulses exceeding a predetermined amplitude. The duration of the pulses developed by threshold detector 22 corresponds to the period for which the detected particle pulses exceed the threshold or predetermined amplitude of threshold detector 22. The pulses developed by threshold detector 22 are coupled to pulse shaper 24 and pulse width adjustment circuit 26 via conductor B as in the apparatus described with reference to FIG. 1. Pulse shaper 24 develops pulses of fixed predetermined duration in response to the pulses coupled from threshold detector 22 which are coupled to pump circuit 28 via conductor D.

In this embodiment, pump circuit 28 is identical to the combination of pump circuit 28 and low pass filter 32 of FIG. 1, and to pump circuit 42. Pump circuit 28 will develop a voltage signal which is proportional to the repetition rate of the pulses coupled from pulse shaper 24. The voltage signal developed by pump circuit 28 is coupled to one input of comparator 34.

Pulse width adjustment circuit 26 develops first pulses at conductor C in response to the pulses coupled from threshold detector 22 each having a duration greater than their corresponding detected pulses by a predetermined function of the duration of the corresponding detected pulses. The first pulses developed by pulse width adjustment circuit 26 are coupled via conductor C to chopper circuit 44.

Variable frequency oscillator 36 develops symmetrical output pulses and couples them to pulse shaper 38 via conductor H. Pulse shaper 38 develops pulses of predetermined fixed duration in response to each positive going pulse coupled from variable frequency oscillator 36 and couples these pulses to chopper circuit 44 and counter 40 via conductor G. The pulses developed by pulse shaper 38 in this embodiment have a short duration. For example they may have a duration in the order of fifty to one hundred nanoseconds. The pulses coupled to counter 40 are counted in order to yield their desired error-corrected count.

In the embodiment shown, chopper circuit 44 includes a VETO gate 56. The short duration pulses developed by pulse shaper 38 are coupled to one input 58 of VETO gate 56. The first pulses developed by pulse width adjustment circuit 26 are coupled via conductor C to the VETO input 60 of VETO gate 56. In this embodiment, VETO gate 56 will operate such that probability of a given pulse from pulse shaper 38 being blocked equals the duty cycle of the pulse train fed to VETO input 60 of VETO gate 56. This is true because while the pulses at C occur at random, the pulses at G are evenly spaced whenever the voltage at control input 47 is constant. When first pulses are not present at the VETO input 60 of VETO gate 56, pulses coupled to input 58 of VETO gate 56 will cause VETO gate 56 to develop a positive or "one" output or second pulse for the duration of the pulse coupled to input 58. If a first pulse is present at VETO input 60 of VETO gate 56 pulses coupled to input 58 at the same time will be blocked or inhibited, and VETO gate 56 will not develop a positive or "one" signal in response to these signals.

The second pulses produced by VETO gate 56 are coupled via conductor F to a pulse shaper 62. Pulse shaper 62 is identical to pulse shaper 24 in FIG. 1 and can be a monostable multivibrator which changes for a predetermined period of time in response to an input pulse then reverts to its original state. The pulses of predetermined fixed duration developed by pulse shaper 62 in response to pulses coupled from VETO gate 56 are coupled via conductor E to pump circuit 64. Pump circuit 64 is identical to pump circuit 42 in FIG. 1, and will develop a voltage signal which varies in accordance with the repetition rate of the predetermined fixed duration pulses coupled thereto from pulse shaper 62. The varying voltage signal developed from pump circuit 64 is coupled to the second input of comparator 34.

Comparator 34 in FIG. 2 operates in a manner identical to comparator 34 in FIG. 1. That is, if the signals coupled to the inputs of comparator 34 are equal, comparator 34 will develop a zero control signal at its output. If the signal coupled from pump circuit 28 to comparator 34 is greater than the signal coupled from pump circuit 64, comparator 34 will develop a positive control signal; and comparator 34 will develop a negative control signal if the opposite condition occurs. The control signal developed by comparator 34 is coupled to low pass amplifier 41 where it is filtered and amplified, and coupled to the control input 47 of variable frequency oscillator 36. Variable frequency oscillator 36 is responsive to the control signal coupled to its control input 47 to change its frequency in proportion to the magnitude of the control signal.

The result of the operation of the apparatus shown in FIG. 2 is to cause variable frequency oscillator 36 to develop an output signal on conductor H whose frequency or repetition rate is greater than the repetition rate of the detected particle pulses coupled from the Coulter type particle detector 20. The difference in the repetition rate of the signals developed by variable frequency oscillator 36 and the resultant difference in the number of pulses per unit time coupled to counter 40 via conductor G is related to the repetition rate and duration of the detected particle pulses. The voltage signal resulting from this chopping function will have a nonlinear relationship to the voltage signal developed as a result of the repetition rate of the detected particle pulses. The nonlinear relationship corresponds to the nonlinear relationship necessary in order to compensate for coincidence errors introduced as a result of the repetition rate of the detected particles. The voltage signal from chopper circuit 44, when compared with the voltage signal which is developed as a result of the repetition rate of the detected particle pulses, will yield a control voltage which is coupled to the oscillator in order to cause the oscillator 36 to change its frequency and repetition rate and develop pulses representative of the true or corrected count of the number of particles being detected.

Again, as with FIG. 1, the connection from amplifier 41 to the control input of variable frequency oscillator 36 constitutes a feedback loop which provides a closed loop system whose response to variations in repetition rate and duration of detected pulses is limited only by circuit time constants, thereby quickly modifying the number of errorcorrected pulses generated, in a nonlinear manner, in order to accumulate continuously a true and corrected count.

Figure 3A:
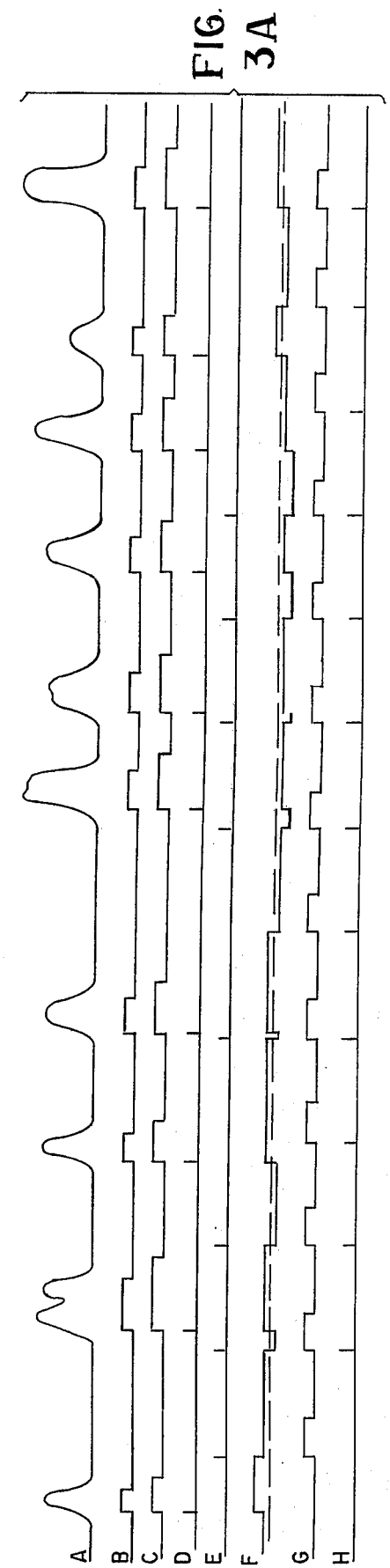
FIG. 3A is a waveform diagram showing waveforms at various locations in the apparatus shown in FIG. 3.

The apparatus shown in FIG. 3 corresponds in substantial detail to the apparatus shown in FIG. 2. Elements which operate in the same manner as, and perform the same function as is described in FIG. 2 are given the same number and letter designation. The operation of these elements will not be explained with reference to the apparatus as shown in FIG. 3 as they have been explained in detail with reference to the apparatus and like elements shown in FIG. 2. FIG. 3A does, however, show the waveforms at various conductors in the system of FIG. 3 in order to provide a more clear understanding of the operation of this apparatus. Comparing the apparatus shown in FIGS. 2 and 3, pump circuits 28 and 64 and pulse shaper circuit 62 shown in the apparatus of FIG. 2 have been omitted from the apparatus shown in FIG. 3. Furthermore, comparator 34 in the system of FIG. 2 has been replaced by a comparison means 68 which includes an up-down counter 70 and a digital-to-analog converter 72.

In the apparatus shown in FIG. 3, the pulses of uniform fixed duration developed by pulse shaper 24 are coupled via conductor D to an input of up-down counter 70. This input is the up count input causing u-down counter to count up or in an increasing numerical order in response to each pulse coupled from pulse shaper 24. The second pulses developed by chopper circuit 44 are coupled via conductor E to a second input of up-down counter 70. This second input is the down count input causing up-down counter 70 to count down or in decreasing numerical order in response to each second pulse coupled from chopper circuit 44. The count developed by up-down counter 70 is shown in waveform F of FIG. 3A as represented by the output at F of digital-to-analog (D/A) converter 72. Digital-to-analog converter 72 will convert the count to an analog voltage. As the count accumulated by up-down counter 70 is continually varying in accordance with the repetition rate of the pulses coupled to the inputs, the voltage developed by digital-to-analog converter 72 will vary correspondingly. The voltage developed by digital-to-analog converter 72 is coupled via conductor F to low pass amplifier 41 and is shown in dotted line fashion in waveform F of FIG. 3A. This voltage is filtered and amplified by low pass amplifier 41 and coupled to the control input 47 of variable frequency oscillator 36 in order to adjust the frequency of variable frequency oscillator 36 as previously explained with reference to the apparatus shown in FIG. 2.

Referring to FIG. 4 another version of the comparison means 68 of FIG. 3 is shown. Conductors D and E in FIG. 3 are coupled to the inputs of up-down counter 70 as is shown in FIG. 4. In this embodiment however the digital-to-analog converter 72 shown in FIG. 3 has been eliminated and low pass amplifier 41 has been placed within the dotted lines representing the comparison means 68 shown in FIG. 3. In this embodiment, the most significant bit only is used in order to bring the apparatus to equilibrium. That is, up-down counter 70 will develop only a one or zero output in response to the count of the pulses coupled thereto via conductors D and E. Up-down counter 70 is preset in this embodiment at, for example, one-half its count capacity. Pulses arriving via conductor D from pulse shaper 24 will cause up-down counter 70 to count up or in numerically increasing order as described with regard to the apparatus shown in FIG. 3. Pulses coupled to up-down counter 70 from chopper circuit 44 via conductor E will cause up-down counter 70 to count in decreasing numerical order. When the count in up-down counter 70 is in excess of one-half the count capacity, a "one" will be developed by counter 70; and a "zero" will be developed when the count is less than one-half the count capacity. The "zero" or "one" as the case may be will be coupled to low pass amplifier 41 where it is filtered and amplified and coupled to the control input 47 of variable frequency oscillator 36 as shown in FIG. 3. A "one" will cause variable frequency oscillator 36 to continuously increase in frequency, and a "zero" will cause variable frequency oscillator 36 to continually decrease in frequency. When a corrected count has been achieved, up-down counter 70 will fluctuate very closely about the count equal to one-half the capacity of the counter. This will cause "ones" and "zeros" to alternately be developed at the output and coupled by low pass amplifier 41 to variable frequency oscillator 36. This rapidly shifting between "ones" and "zeros" at the control input 47 of variable frequency oscillator 36 will cause variable frequency oscillator 36 to stabilize at or within a very small range of frequency variation. This range of frequency variation is small enough in order to yield a count at counter 40 in FIG. 3 which is substantially the true error corrected count for the detected particle pulses.

Referring to FIG. 5, an alternate to the circuitry shown in comparison means 68 of FIG. 4 is shown. In the embodiment shown in FIG. 5, an RS bistable multivibrator 78, commonly known as an RS type of flip-flop, or RS flip-flop, is shown in place of up-down counter 70. Bistable multivibrator 78 will switch to one state in response to pulses coupled to its "set" input from pulse shaper 24 via conductor D and will switch to a second state in response to pulses coupled to its "reset" input from chopper circuit 44 via conductor E. The output of bistable multivibrator 78 is coupled through resistor 80 to one input of low pass amplifier 41. In this embodiment, amplifier 41 is shown as an integrator amplifier 82. The "ones" and "zeros" developed by bistable multivibrator 78 will be integrated by integrator 82 and develop a voltage which varies in accordance with the rate at which multivibrator 78 changes state, and the duration during which multivibrator 78 is in any particular state. The voltage developed by integrator amplifier 82 will be coupled to the control input 47 of variable frequency oscillator 36 in order to vary the frequency of variable frequency oscillator 36 as explained with regard to the apparatus shown in FIGS. 1, 2, and 3. The system will be in equilibrium when the number of "set" pulses is approximately equal to the number of "reset" pulses in a particular time period.

It is to be understood that the method for generating error-corrected signals as hereinbefore described with reference to the apparatus used for performing this function is also considered novel. This method includes the steps of generating error-corrected pulses and varying the repetition rate of the error corrected pulses in accordance with variations in an applied control signal; developing first pulses in response to and detected signals each having a duration equal to the combined duration of one of the detected particle pulses and a predetermined function of the same one of the detected particle pulses; developing second signals in response to the error corrected signals and the first signals which vary in accordance with the repetition rate of error-corrected pulses, and the repetition rate and duration of the first signals; and comparing the detected particle pulses and the second signals and developing the control signal for varying the repetition rate of the error-corrected pulses in accordance with the difference between the second signals and the repetition rate of the detected particle pulses.

As can be seen, an improved method and apparatus for generating error corrected signals subject to coincidence error has been shown and described. The system and method provides for a rapid and automatic correction for errors in detection of particles due to coincidence. The number of error-corrected pulses generated is related in a nonlinear manner to the number of detected particle pulses and is determined in accordance with the repetition rate and duration of the detected particle pulses.

What it is desired to secure by letters patent of the United States is:

1. A method for generating error corrected signals in response to detected signals which are subject to error due to coincidence including the steps of:
   generating the error corrected signals,
   varying the repetition rate of the error corrected signals in accordance with variations in an applied control signal,
   developing first signals in response to the detected signals each having a duration equal to a predetermined function of the duration of the same one of the detected signals,
   developing second signals in response to the error corrected signals and said first signals which vary in accordance with the repetition rate and duration of said second signals and the repetition rate of the error-corrected signals, and
   comparing said second signals and the detected signals and developing said control signal, said control signal varying in accordance with variations between said second signals and the repetition rate of said detected signals.

2. The method of claim 1 wherein said step of developing said second signals includes the steps of:
   generating third signals in response to said error corrected signals having a repetition rate which varies in accordance with the repetition rate of the error corrected signals, said third signals having a predetermined duration, and
   developing said second signals in response to said third signals.

3. The method of claim 2 wherein said step of comparing the detected signals and said second signals includes the step of:
   developing fourth signals in response to said detected signals having a repetition rate which varies in accordance with said detected signals, said fourth signals having a fixed duration, and
   comparing said fourth signals with said second signals.

4. The method of claim 3 wherein said step of developing said second signals includes the step of:
   inhibiting the development of said second signals in response to said third signals when said first signals are present.

5. The method of claim 4 wherein said step of developing said first signals includes the step of:
   extending the duration of each one of the detected signals by a predetermined function of the duration of the same one of the detected signals.

6. An error correction circuit for correcting first signals which are subject to error including in combination,
   generating means for generating error corrected signals, said error corrected signals being variable in accordance with a control signal coupled to said generating means, receiving means for receiving said first signals, signal modifying means coupled to said receiving means and operative in response to said first signals to develop second signals, which vary in accordance with said first signals, first circuit means coupled to said generating means and said signal modifying means and operative to develop third signals in response to said second signals and error corrected signals, and second circuit means coupled to said receiving means, said first circuit means and said generating means and operative in response to said first signals and said third signals to develop said control signal, 7. The circuit of claim 6 wherein said generating means is a variable frequency oscillator for generating said error corrected signals, said error corrected signals varying in frequency in accordance with said control signal coupled thereto.

8. The circuit of claim 6 wherein the first signals have first signal durations and said signal modifying means includes signal duration modifying means responsive to the first signals to develop said second signals having signal durations which are functions of the durations of the first signals.

9. The circuit of claim 6 wherein said second circuit means includes comparison means operative in response to the first signals and said third signals to develop said control signal.

10. The circuit of claim 8 wherein said first circuit means includes control circuit means operative in response to the error corrected signals to develop said third signals and operative in response to said second signals to control development of said third signals.

11. The circuit of claim 10 wherein the first signals are first pulses having pulse durations and said signal duration modifying means is a pulse duration modifying circuit for developing second pulses having durations which are functions of the durations of the first pulses.

12. The circuit of claim 11 wherein the first signals have varying amplitudes, said receiving means including detecting means for detecting the first signals having particular amplitudes.

13. The circuit of claim 12 wherein said pulse duration modifying circuit includes a pulse stretching circuit for developing second pulses having a pulse duration greater than the first pulses by a predetermined percentage of the duration of the first pulses.

14. The circuit of claim 12 wherein said control circuit means is a chopper circuit operative in response to the error corrected signals to develop said third signals, said chopper circuit being operative in response to said second pulses to chop said third signals for said duration of said second pulses.

15. The circuit of claim 13 wherein said control circuit means is a gating circuit operative in response to the error corrected signals to develop said third signals and operative in response to said second pulses to inhibit said third signals for the duration of said second pulses.

16. The circuit of claim 14 wherein the first pulses have an irregular repetition rate, and wherein said receiving means includes pulse storage means coupled to said detecting means and said second circuit means for developing a pulse storage signal in response to the repetition rate of the first pulses which varies in accordance with the repetition rate of the first pulses, said control circuit means including filter means coupled to said chopper circuit and said second circuit means for developing a filter signal in response to said chopped third signals which varies in accordance with said chopped third signals, said second circuit means operative in response to said filter signal and said pulse storage signal to develop said control signal.

17. The circuit of claim 16 wherein said second circuit means includes comparison means for developing said control signal, said control signal varying in accordance with the difference between said pulse storage signal and said filter signal.

18. The circuit of claim 16 wherein said generating means is a variable frequency oscillator having a frequency which varies in accordance with said control signal.

19. An apparatus for automatically generating error corrected pulses in response to particle pulses which are subject to error due to coincidence including in combination, generating means for generating the error corrected pulses, said repetition rate of the error corrected pulses being variable in accordance with a control signal coupled to said generating means, receiving means for receiving the particle pulses, pulse duration modifying means coupled to said receiving means and operative in response to the particle pulses to develop first pulses having a duration equal to the duration of the particle pulses and at least a predetermined percentage of the duration of the particle pulses, control circuit means coupled to said pulse duration modifying means and said generating means and operative in response to the error corrected pulses to develop a second signal, said control circuit means being further operative in response to said first pulses to control development of said second signal, and comparison means coupled to said receiving means, said control circuit means and said generating means for developing said control signal, said control signal varying in accordance with the difference between the repetition rate of the particle pulses and said second signal.

20. The apparatus of claim 19 wherein said receiving means includes detecting means for detecting the particle pulses having particular amplitudes.

21. The apparatus of claim 20 wherein said receiving means includes a first pulse generator coupled to said detecting means for developing first fixed duration pulses in response to said particle pulses.

22. The apparatus of claim 21 further including second pulse generator means coupled between said generating means and said control circuit means for generating second fixed duration pulses in response to said error corrected pulses.

23. The apparatus of claim 22 wherein said generating means is a variable frequency oscillator having a frequency which varies in accordance with said control signal.

24. The apparatus of claim 23 wherein said receiving means further includes first pulse storage means coupled to said first pulse generator means and said comparison means for developing a pulse storage signal which varies in accordance with the repetition rate of said first fixed duration pulses.

25. The apparatus of claim 24 wherein said control circuit is a chopper circuit operative in response to said error corrected pulses to develop said second signal and further operative in response to said first pulses to chop said second signal for said duration of said first pulses, and filter means coupled to said chopper circuit and said comparison means for developing a filter signal in response to said chopped second signal.

26. The apparatus of claim 25 wherein said comparison means is a comparator for comparing said pulse storage signal and said filter signal to develop said control signal, said control signal varying in accordance with the difference between said pulse storage signal and said filter signal.

27. The apparatus of claim 23 wherein said control means is a gate circuit operative in response to said error corrected pulses to develop said second signal, said second signal being gate pulses, said gate circuit being further operative in response to said first pulses to inhibit said gate pulses for said duration of said first pulses.

28. The apparatus of claim 27 wherein said control means further includes a third pulse generator means coupled to said gate circuit, said third pulse generator means operative in response to said gate pulses to develop third fixed duration pulses and second pulse storage means coupled to said third pulse generator means and said comparison means for developing a second pulse storage signal in response to the repetition rate of said third fixed duration pulses.

29. The apparatus of claim 28 wherein said comparison means is a comparator for comparing said first fixed duration pulses and said second pulse storage signal and developing said control signal, said control signal varying in accordance with the difference between said first fixed duration pulses and said second pulse storage signal.

30. The apparatus of claim 27 wherein said comparison means is a counter means, said counter being operative to add said first fixed duration pulses coupled thereto and substract said gate pulses coupled thereto and develop a count signal in accordance with a count of said added and subtracted pulses, and converter means coupled to said counter means and operative in response to said count signal to develop said control signal, said control signal varying in accordance with said count.

31. The apparatus of claim 27 wherein said comparison means includes a bistable multivibrator operative in response to said first fixed duration pulses to develop a first output signal and operative in response to said gate pulses to develop a second output signal and converter means coupled to said bistable multivibrator means and operative in response to said first and second output signals to develop said control signal, said control signal varying in accordance with the difference in repetition rate between said first and second output signals.

32. The apparatus of claim 23 wherein said pulse duration modifying means is a pulse stretcher for stretching said detected pulses to develop said first pulses.

* * * * *

UNITED STATES PATENT AND TRADEMARK OFFICE
CERTIFICATE OF CORRECTION

PATENT NO. : 3,936,739
DATED : February 3, 1976
INVENTOR(S) : WALTER R. HOGG

It is certified that error appears in the above-identified patent and that said Letters Patent are hereby corrected as shown below:

Column 1, line 25, change "counter" to -- count --.

Column 4, line 11, change "are" (first occurrence) to -- and --.

Column 6, line 67, after "changes" insert -- states --.

Column 7, line 60, Between "error" and "corrected" insert a hyphen (-).

UNITED STATES PATENT AND TRADEMARK OFFICE
CERTIFICATE OF CORRECTION

PATENT NO. : 3,936,739

DATED : February 3, 1976

INVENTOR(S) : WALTER R. HOGG

It is certified that error appears in the above-identified patent and that said Letters Patent are hereby corrected as shown below:

Claim 1, line 4, before "generating" insert -- independently line 4, delete "the".

line 5, after "rate" insert -- only --.

Claim 6, line 4, after "for" insert -- independently -- line 5, at the beginning of the line before "said" insert -- the repetition rate only of --.

line 15, delete "second";

line 16, delete "signals and" (first occurrence);

line 16, after the comma (,) add -- said third signals varying in accordance with the presence of said second signals, line 17, after "means" delete "coupled" and insert -- connected --.

UNITED STATES PATENT AND TRADEMARK OFFICE
CERTIFICATE OF CORRECTION

PATENT NO. : 3,936,739

DATED : February 3, 1976

INVENTOR(S) : WALTER R. HOGG

It is certified that error appears in the above-identified patent and that said Letters Patent are hereby corrected as shown below:

Claim 19, line 6, after "pulses" insert -- independent of any input signal -- line 6, after "rate" insert -- only --.

line 23, delete "coupled" and insert -- connected --.

Signed and Sealed this

Third Day of August 1976

[SEAL]

Attest:

RUTH C. MASON
*Attesting Officer*

C. MARSHALL DANN
*Commissioner of Patents and Trademarks*

UNITED STATES PATENT AND TRADEMARK OFFICE
CERTIFICATE OF CORRECTION

PATENT NO. : 3,936,739
DATED : February 3, 1976
INVENTOR(S) : Walter R. Hogg

It is certified that error appears in the above–identified patent and that said Letters Patent are hereby corrected as shown below:

Column 10, line 27, change "second" to --first--.

Signed and Sealed this

Twentieth Day of December 1977

[SEAL]

Attest:

RUTH C. MASON
Attesting Officer

LUTRELLE F. PARKER
Acting Commissioner of Patents and Trademarks